United States Patent
Lee et al.

(10) Patent No.: US 11,955,202 B2
(45) Date of Patent: Apr. 9, 2024

(54) MULTILEVEL CONTENT ADDRESSABLE MEMORY, MULTILEVEL CODING METHOD OF AND MULTILEVEL SEARCHING METHOD

(71) Applicant: MACRONIX INTERNATIONAL CO., LTD., Hsinchu (TW)

(72) Inventors: Ming-Hsiu Lee, Hsinchua (TW); Po-Hao Tseng, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 18/055,855

(22) Filed: Nov. 16, 2022

(65) Prior Publication Data

US 2023/0075257 A1   Mar. 9, 2023

Related U.S. Application Data

(62) Division of application No. 17/383,562, filed on Jul. 23, 2021, now Pat. No. 11,532,337.

(51) Int. Cl.
*G11C 15/00*   (2006.01)
*G11C 7/10*   (2006.01)
*G11C 15/04*   (2006.01)

(52) U.S. Cl.
CPC .......... *G11C 7/1063* (2013.01); *G11C 7/1069* (2013.01); *G11C 7/109* (2013.01); *G11C 7/1096* (2013.01); *G11C 15/04* (2013.01)

(58) Field of Classification Search
CPC ...................................................... G11C 15/046

USPC ........................................................ 365/49.1
See application file for complete search history.

(56) References Cited

U.S. PATENT DOCUMENTS

| | | | | |
|---|---|---|---|---|
| 4,126,764 A | * | 11/1978 | Downey | H04L 1/0083 370/472 |
| 6,499,081 B1 | | 12/2002 | Nataraj et al. | |
| 7,010,736 B1 | * | 3/2006 | Teh | G11C 29/12005 365/201 |
| 7,355,890 B1 | * | 4/2008 | Wen | G11C 15/04 365/49.1 |
| 8,934,278 B2 | | 1/2015 | Vattikonda et al. | |
| 10,957,391 B2 | | 3/2021 | Barth, Jr. et al. | |
| 2007/0096836 A1 | * | 5/2007 | Lee | H03L 7/085 331/57 |
| 2012/0218822 A1 | * | 8/2012 | Roohparvar | G11C 16/08 365/49.17 |

FOREIGN PATENT DOCUMENTS

| | | |
|---|---|---|
| TW | 525186 B | 3/2003 |
| TW | 201440053 A | 10/2014 |

* cited by examiner

*Primary Examiner* — Hoai V Ho
(74) *Attorney, Agent, or Firm* — McClure, Qualey & Rodack, LLP (57) ABSTRACT

A multilevel content addressable memory, a multilevel coding method and a multilevel searching method are provided. The multilevel coding method includes the following steps. A highest decimal value of a multilevel-bit binary data is obtained. A length of a digital string data is set as being the highest decimal value of the multilevel-bit binary data. The multilevel-bit binary data is converted into the digital string data. If a content of the multilevel-bit binary data is an exact value, a number of an indicating bit in the digital string data is the exact value.

12 Claims, 11 Drawing Sheets

FIG. 15 ial value of "111", "011", "001" and
MULTILEVEL CONTENT ADDRESSABLE MEMORY, MULTILEVEL CODING METHOD OF AND MULTILEVEL SEARCHING METHOD This is a divisional application of U.S. application Ser. No. 17/383,562, filed Jul. 23, 2021, the subject matter of which is incorporated herein by reference.

TECHNICAL FIELD

The disclosure relates in general to a memory, a coding method and a searching method thereof, and more particularly to a multilevel content addressable memory, a multilevel coding method and a multilevel searching method.

BACKGROUND

A content addressable memory (CAM) is a special type of memory that can identify the address of a stored word in the memory array which has the same content with the input search word. The CAM supplies a very powerful functionality for many applications, especially in pattern matching and search.

In general, a CAM compares the stored word and the input search word in binary format, that is, the data in the stored word and the input search word is either 0 or 1.

SUMMARY

The disclosure is directed to a multilevel content addressable memory (MCAM), a multilevel coding method and a multilevel searching method. A multilevel-bit binary data is converted into a digital string data, such that the data can be defined with valid ranges for search/comparison.

According to one embodiment, a multilevel coding method of a stored word or an input search word for a multilevel content addressable memory (MCAM) is provided. The multilevel coding method includes the following steps. A highest decimal value of a multilevel-bit binary data is obtained. A length of a digital string data is set as being the highest decimal value of the multilevel-bit binary data. The multilevel-bit binary data is converted into the digital string data. If a content of the multilevel-bit binary data is an exact value, a number of an indicating bit in the digital string data is the exact value.

According to another embodiment, a multilevel searching method for a multilevel content addressable memory (MCAM) is provided. The multilevel searching method includes the following steps. A stored word is stored in at least one NAND string. An input search word is inputted to the NAND string. Each of the stored word and the input search word is converted from a multilevel-bit binary data into a digital string data. If a content of the multilevel-bit binary data is an exact value, a number of an indicating bit in the digital string data is the exact value. A comparison result is outputted. If the digital string data of the input search word overlap the digital string data of the stored word, the comparison result is a match signal.

According to an alternative embodiment, a multilevel content addressable memory (MCAM) is provided. The MCAM includes an input encoder, a memory array and an output encoder. The input encoder is configured to receive an input search word. The memory array comprises a plurality of NAND strings. Each of the NAND strings is configured to store a stored word. Each of the stored words and the input search word is converted from a multilevel-bit binary data into a digital string data. If a content of the multilevel-bit binary data is an exact value, a number of an indicating bit in the digital string data is the exact value. The output encoder is configured to receive a plurality of comparison results from the NAND strings.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 1:
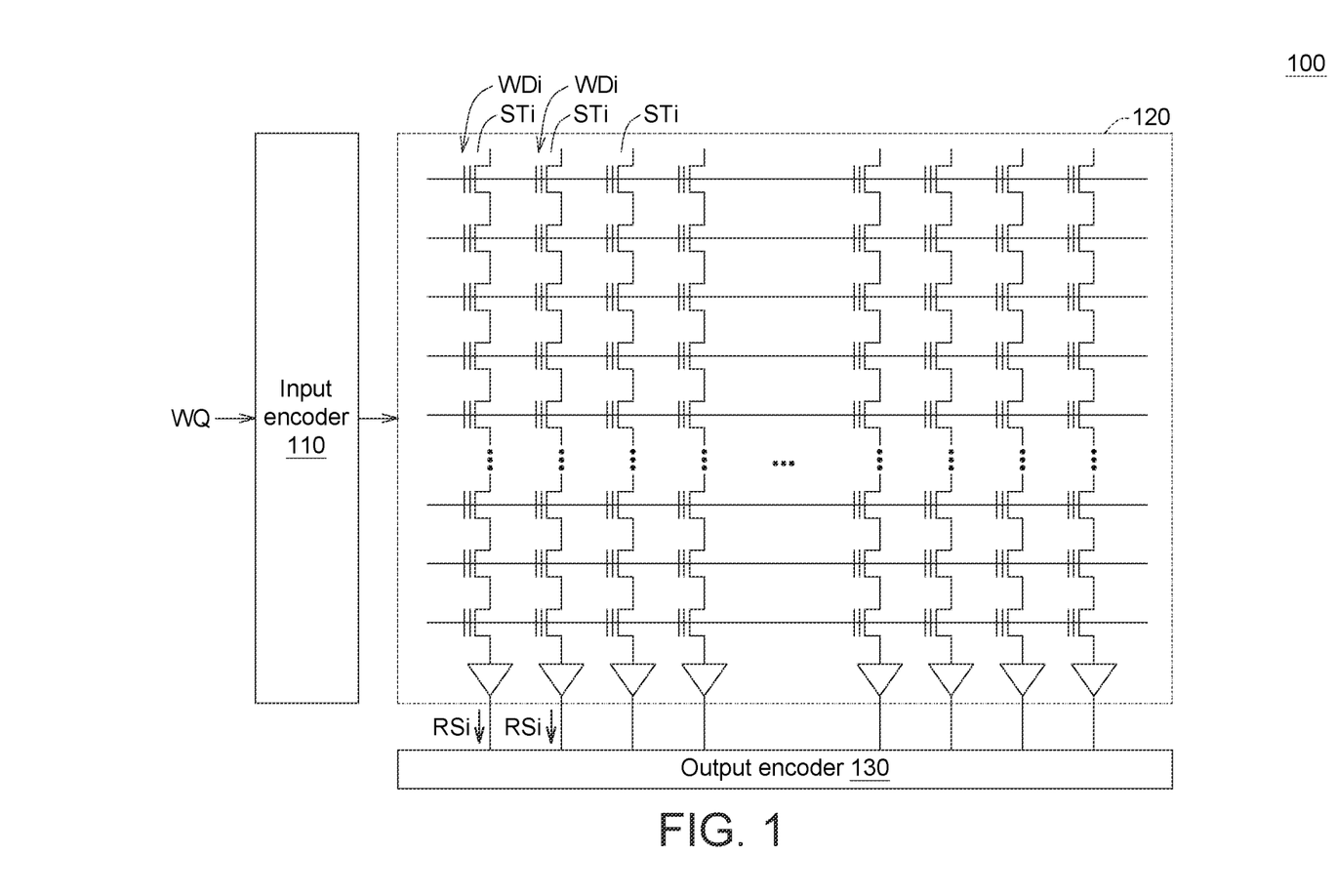
FIG. 1 shows a multilevel content addressable memory (MCAM) according to one embodiment.

Please refer to FIG. 1, which shows a multilevel content addressable memory (MCAM) 100 according to one embodiment. The MCAM 100 includes an input encoder 110, a memory array 120 and an output encoder 130. The memory array 120 includes a plurality of NAND strings STi. Each of the NAND string STi stores one stored word WDi. The input encoder 110 receives an input search word WQ. The input search word WQ is compared with the stored words WDi and then outputs a plurality of comparison results RSi. The output encoder 130 receives the comparison results RSi from the NAND strings STi. For example, if one of the stored words WDi is matched with the input search word WQ, the comparison result RSi is a match signal, such as "1"; if one of the stored words WDi is not matched with the input search word WQ, the comparison result RSi is a mismatch signal, such as "0." The output encoder 130 outputs the addresses of the NAND strings STi whose stored words WDi are matched with the input search word WQ.

Figure 2:
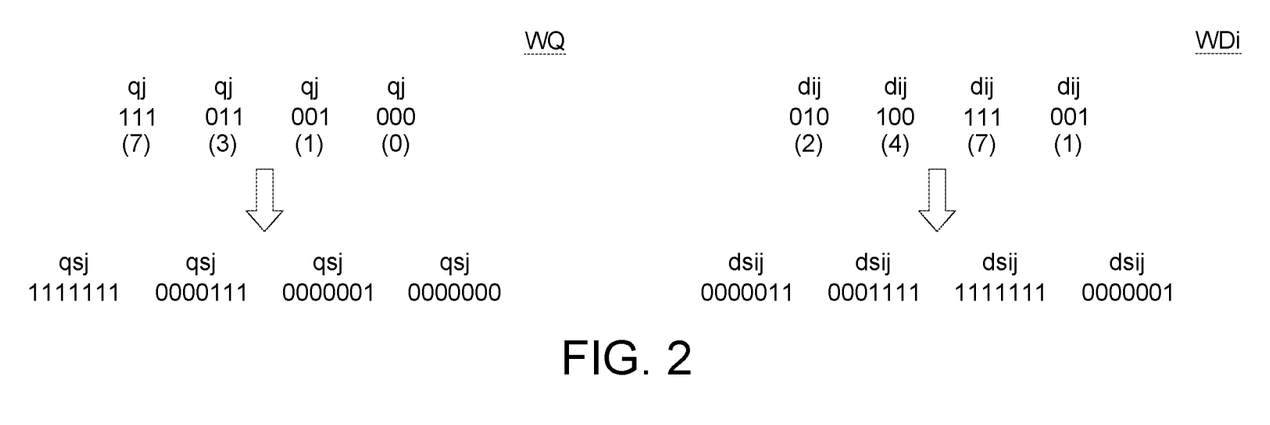
FIG. 2 illustrates the content of the input search word and the stored word.

Please refer to FIG. 2, which illustrates the content of the input search word WQ and the stored word WDi. In one embodiment, the input search word WQ is composed of a plurality of multilevel-bit binary data qj. As shown in FIG. 2, the multilevel-bit binary data qj is "111", "011", "001" and "000," The decimal value of "111", "011", "001" and "000" are "7", "3", "1" and "0" respectively. The stored word WDi is composed of a plurality of multilevel-bit binary data dij. As shown in FIG. 2, the multilevel-bit binary data dij is "010", "100", "111" and "001." The decimal value of "010", "100", "111" and "001" are "2", "4", "7" and "1" respectively.

In the present embodiment, each of the multilevel-bit binary data qj is converted into a digital string data qsj. For example, "111", "011", "001" and "000" are converted into "1111111", "00001111", "0000001" and "0000000."

Similarly, each of the multilevel-bit binary data dij is converted into a digital string data dsij. For example, "010", "100", "111" and "001" are converted into "0000011", "0001111", "1111111" and "0000001."

Please refer to Table I, which illustrates the digital string data qsj, dsij converted from the multilevel-bit binary data qj, dij according to one embodiment. The decimal value of the multilevel-bit binary data qj, dij is 0, 1, . . . , 6, 7. The highest decimal value of the multilevel-bit binary data qj, dij is 7. The length of the digital string data qsj, dsij is equal to or larger than the highest decimal value of the multilevel-bit binary data qj, dij. In each of the digital string data qsj, dsij, "1" is an indicating bit. In the example of the table I, the content of the multilevel-bit binary data qj, dij is an exact value, a number of the indicating bit ("1") in the digital string data qsj, dsij is the exact value. The length of the digital string data qsj, dsij is highest decimal value of the multilevel-bit binary data qj, dij (the multilevel-bit binary data qj, dij is three bits, the highest binary value of the multilevel-bit binary data qj, dij is "111" and the highest decimal value of the multilevel-bit binary data qj, dij is "7", the length of the digital string data qsj, dsij is "7").

TABLE I

| multilevel-bit binary data qj, dij | decimal value | digital string data qsj, dsij |
|---|---|---|
| 000 | 0 | 0000000 |
| 001 | 1 | 0000001 |
| 010 | 2 | 0000011 |
| 011 | 3 | 0000111 |
| 100 | 4 | 0001111 |
| 101 | 5 | 0011111 |
| 110 | 6 | 0111111 |
| 111 | 7 | 1111111 |

Further, as shown in table I, the indicating bit ("1") in the digital string data qsj, dsij is piled up at a right side of the digital string data qsj, dsij. In other embodiment, the indicating bit ("1") in the digital string data qsj, dsij may be piled up at the left side of the digital string data qsj, dsij, or may be arranged with a predefined pattern.

Figure 3:
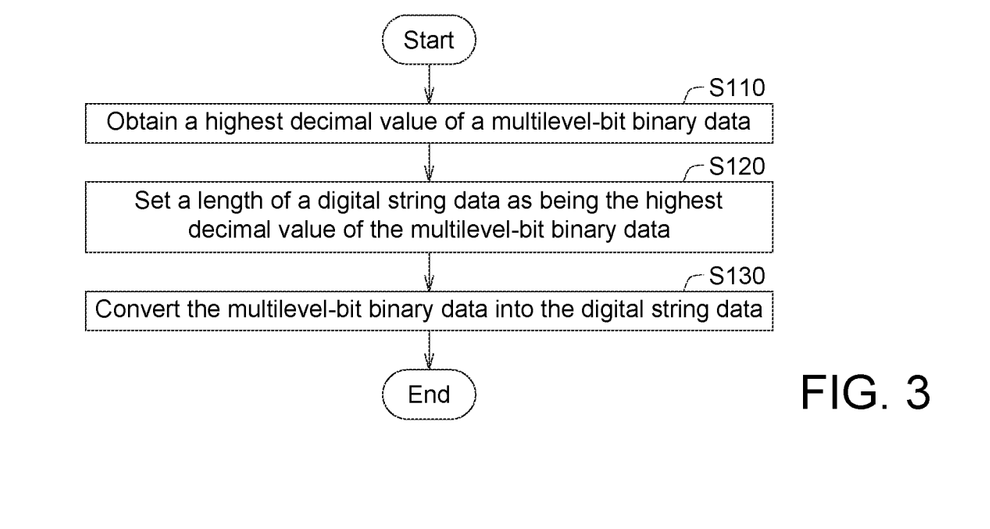
FIG. 3 shows a flowchart of the multilevel coding method of the stored word or the input search word for the MCAM.

Base on above, a multilevel coding method of the stored word WDi or the input search word WQ is provided. Please refer to FIG. 3, which shows a flowchart of the multilevel coding method of the stored word WDi or the input search word WQ for the MCAM 100, In step S110, the highest decimal value of the multilevel-bit binary data qj, dij is obtained. In step S120 the length of the digital string data qsj, dsij is set as being the highest decimal value of the multilevel-bit binary data qj, dij. Then, in step S130, the multilevel-bit binary data qj, dij is converted into the digital string data qsj, dsij.

In other embodiment, the content of the multilevel-bit binary data qj, dij may be a range. Please refer to table II, which illustrates the digital string data qsj, dsij according to another embodiment. If the content of the multilevel-bit binary data qj, dij is a range, a wildcard bit ("X") is used in the digital string data qsj, dsij. The wildcard bit ('X') is also called a don't care bit,

TABLE II

| multilevel-bit binary data qj, dij | decimal value | digital string data qsj, dsij |
|---|---|---|
| 011 | 3 | 0000111 |
| 010, or 011 | 2-3 | 0000X11 |
| 011, or 100, or 101 | 3-5 | 00XX111 |
| 101 | 5 | 0011111 |
| 011, or 100, or 101 | 3-5 | 00XX111 |
| 011, or 100, or 101, or 110 | 3-6 | 0XXX111 |
| 100, or 101, or 110 | 4-6 | 0XX1111 |
| 100, or 101, or 110, or 111 | 4-7 | XXX1111 |

As shown the 7-th row in table H, the content of the multilevel-bit binary data qj, dij is a range from 4 to 6. The high decimal value of the range is 6 and the low decimal value of the range is 4. The range window is 3. The number of the indicating bit ("1") in the digital string data qsj, dsij is 4. The number of the wildcard bit ("X") in the digital string data qsj, dsij is 2. The wildcard bit ("X") is piled up after the indicating bit ("1") in the digital string data qsj, dsij. A sum of the number of the indicating bit ("1") and the number of the wildcard bit ("X") in the digital string data qsj, dsij is 6.

That is, the indicating bit ("1") and the wildcard bit ("X") are arranged according to the following equations (1) to (3).

$$\text{the number of the indicating bit} = \text{the low decimal value of the range} \quad (1)$$

$$\text{the number of the wildcard bit} = \text{the range window} - 1 \quad (2)$$

$$\text{the number of the indicating bit} + \text{the number of the wildcard bit} = \text{the high decimal value of the range} \quad (3)$$

Figure 4:
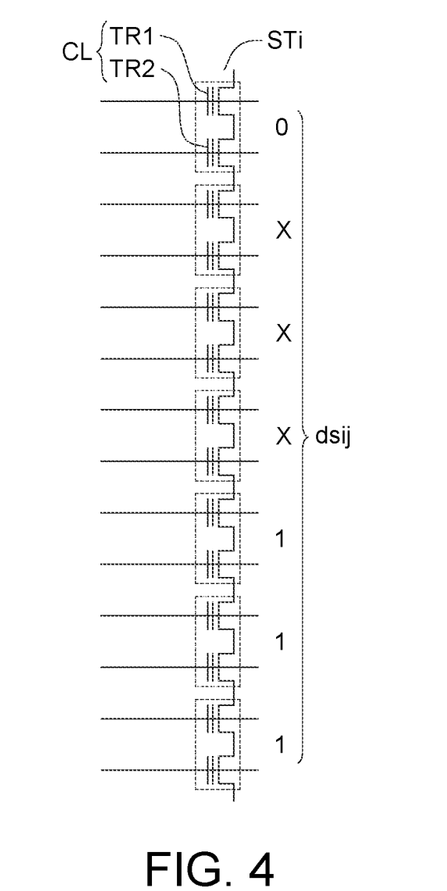
FIG. 4 shows part of one NAND string stored one of the digital string data of the stored word.

Please refer to FIG. 4, which shows part of one NAND string STi stored one of the digital string data dsij of the stored word WDi. As shown in FIG. 4, the decimal value of the multilevel-bit binary data dij is a range of 3 to 6, the digital string data dsij is "0XXX111." The digital string data dsij can be stored in the NAND string STi in sequence. Two transistors TR1, TR2 in each cell CL of the NAND string STi are used together to define "1", "0" or "X." For example, if the transistor TR1 is programmed at a low voltage level and the transistor TR2 is programmed at a high voltage level, the content in this cell CL is defined as "0," If the transistor TR1 is programmed at the high voltage level and the transistor TR2 is programmed at the low voltage level, the content in this cell CL is defined as "1." If the transistor TR1 is programmed at the low voltage level and the transistor TR2 is programmed at the low voltage level, the content in this cell CL is defined as "X." In another embodiment, "1" "0" and "X." can be defined by other encoding scheme.

Figure 5:
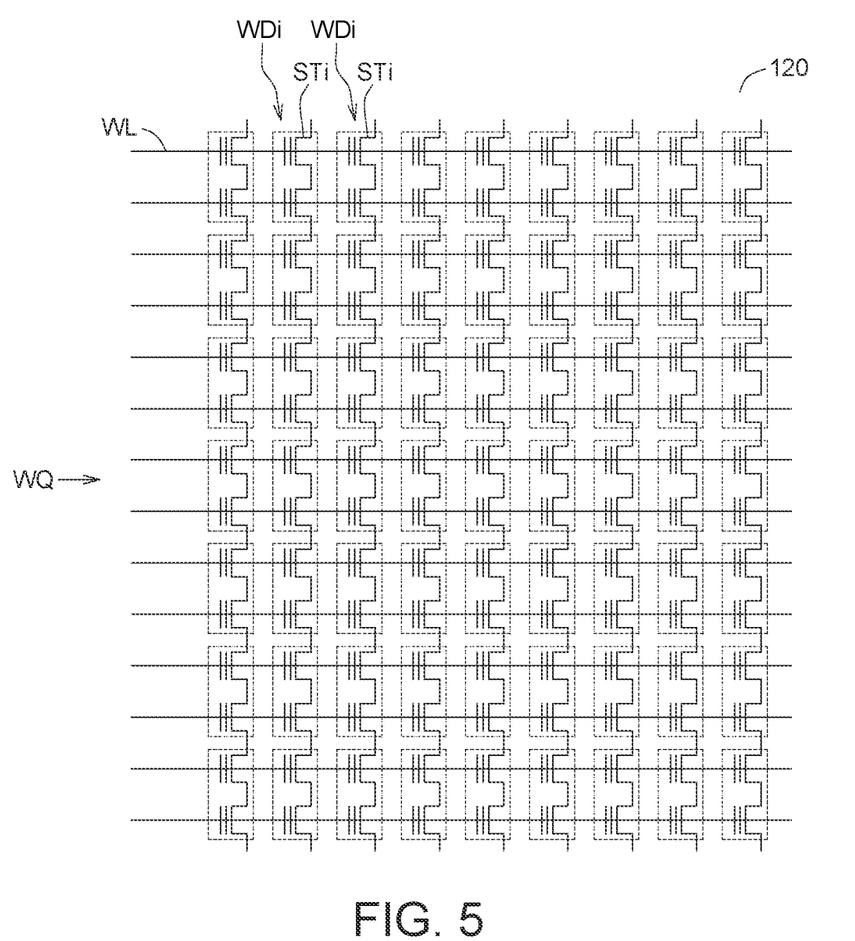
FIG. 5 shows the memory array.

Please refer to FIG. 5, which shows the memory array 120. A plurality of NAND strings STi can be arranged in the memory array 120 as a database for simultaneous searching operation. The input search word \NQ inputted from the word lines WL will be compared with all of the stored words WDi stored in the NAND strings STi. That is to say, a plurality of instances can be searched in one comparing operation, and an ultra-highly-parallel searching function can be achieved.

Figure 6:
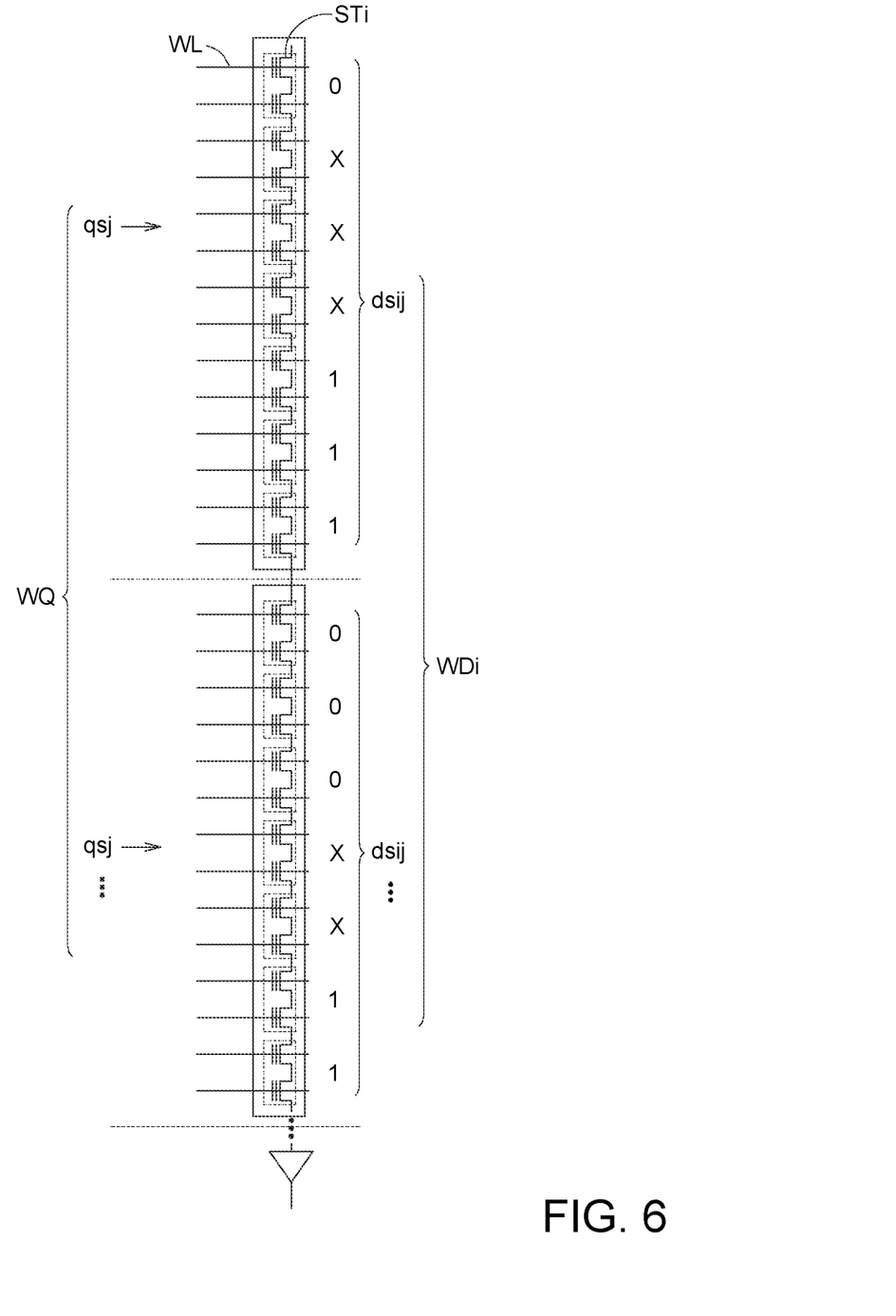
FIG. 6 shows the digital string data stacked in one NAND string.

Please refer to FIG. 6, which shows the digital string data dsij stacked in one NAND string STi. For the memory array 120 with sufficient number of word lines WL, the digital string data dsij in the stored word WDi can be stacked in one NAND string STi.

Figure 7:
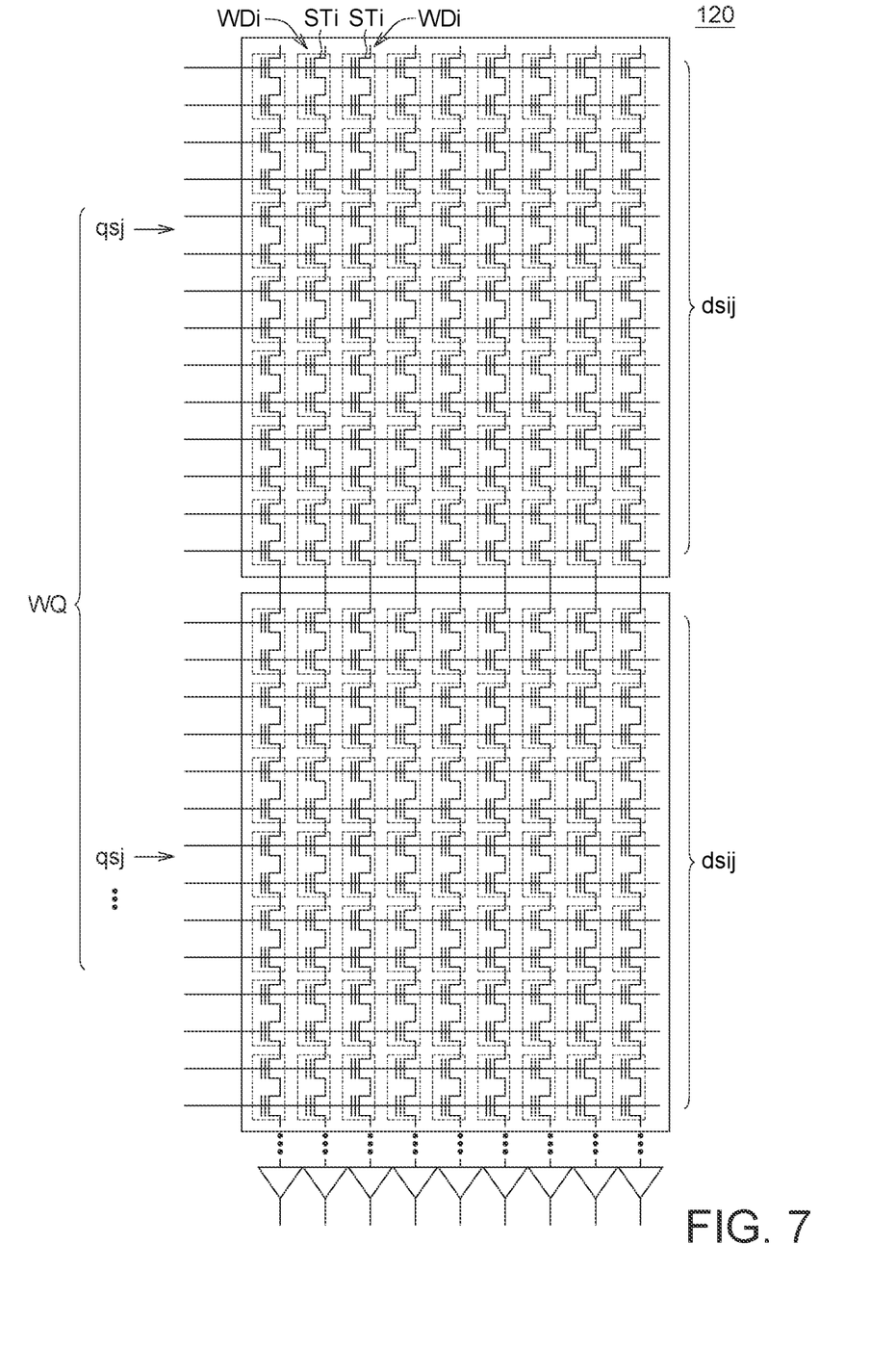
FIG. 7 shows the memory array with stacked digital string data.

Please refer to FIG. 7, which shows the memory array 120 with stacked digital string data dsij. The NAND strings STi that the digital string data dsij are stacked in are arranged in the memory array 120 as a database for simultaneous searching operation. The digital string data qsj of the input search word WQ inputted from the word lines WL will be compared with the stacked digital string data dsij of all of the stored words WDi. That is to say, a plurality of instances can be searched in one comparing operation, and an ultra-highly-parallel searching function can be achieved.

Figure 8:
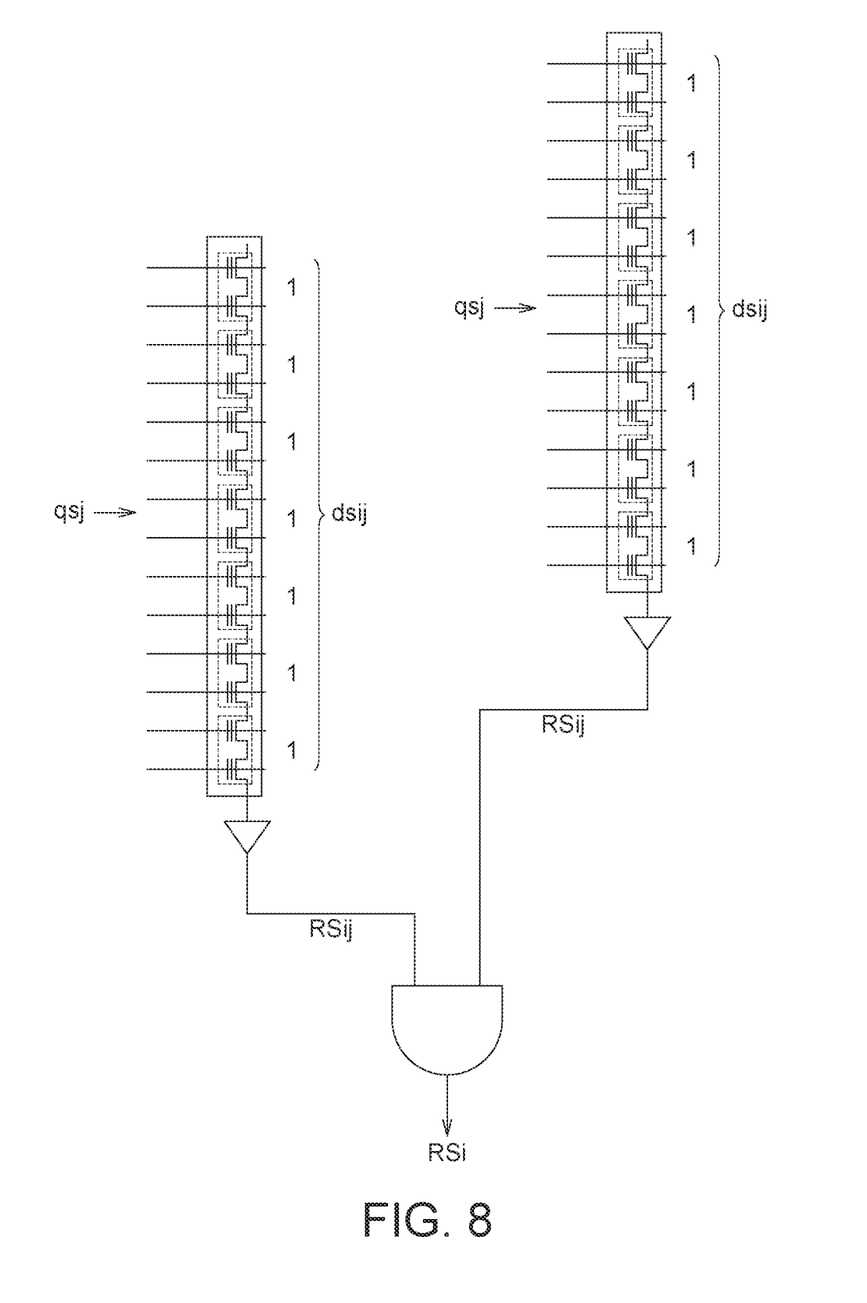
FIG. 8 shows the stored word divided into more than one parts.

Please refer to FIG. 8, which shows the stored word WDi divided into more than one parts. If the stored word WDi is longer than one NAND string STi can accommodate, it is possible to divide the stored word WDi into to more than one parts and store the stored word WDi in more than one NANS strings. The digital string data qsj is inputted to the corresponding part. The comparison results RSij corresponding the parts can be combined by an AND operation to obtain the comparison results RSI.

Figure 9:
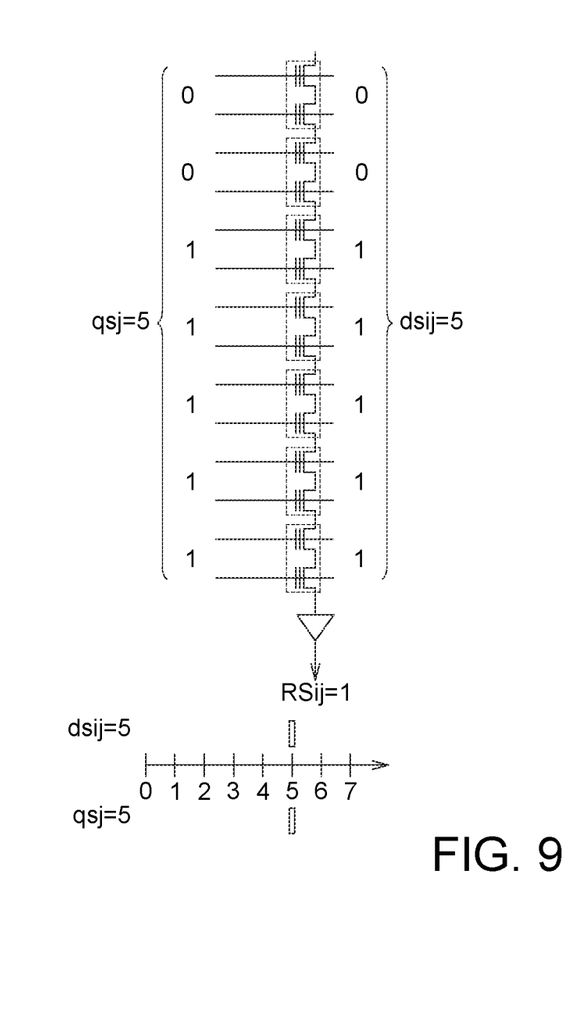
FIGS. 9 to 14 illustrate several examples of the comparison operation for the digital string data and the digital string data.

Please refer to FIGS. 9 to 14, which illustrate several examples of the comparison operation for the digital string data qsj and the digital string data dsij. As shown in FIG. 9, the digital string data qsj is 5, and the digital string data dsij is 5. The digital string data qsj is equal to the digital string data dsij, so the comparison results RSij is the match signal, such as "1."

Figure 10:
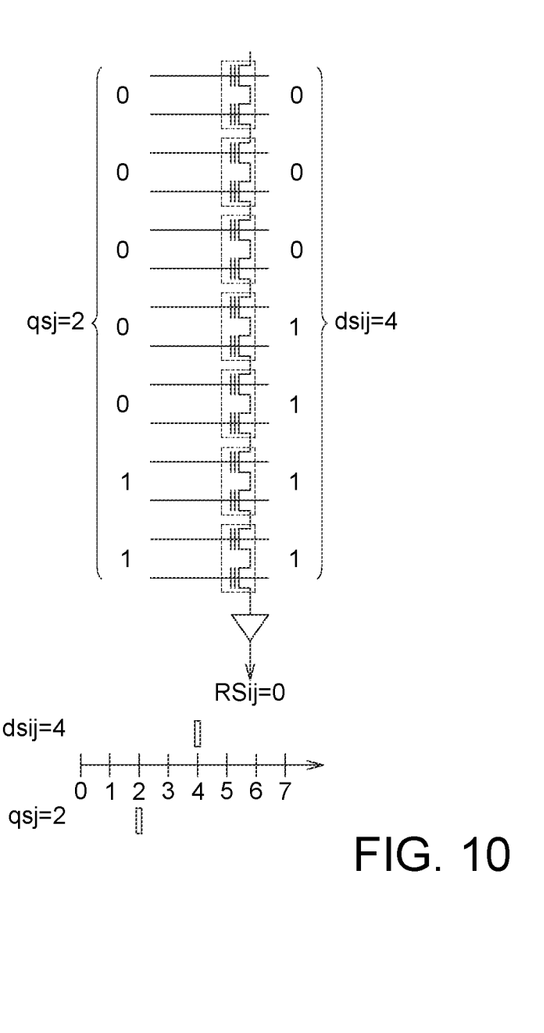

As shown in FIG. 10, the digital string data qsj is 2, and the digital string data dsij is 4. The digital string data qsj does not overlap the digital string data dsij, so the comparison results RSij is the mismatch signal, such as "0."

Figure 11:
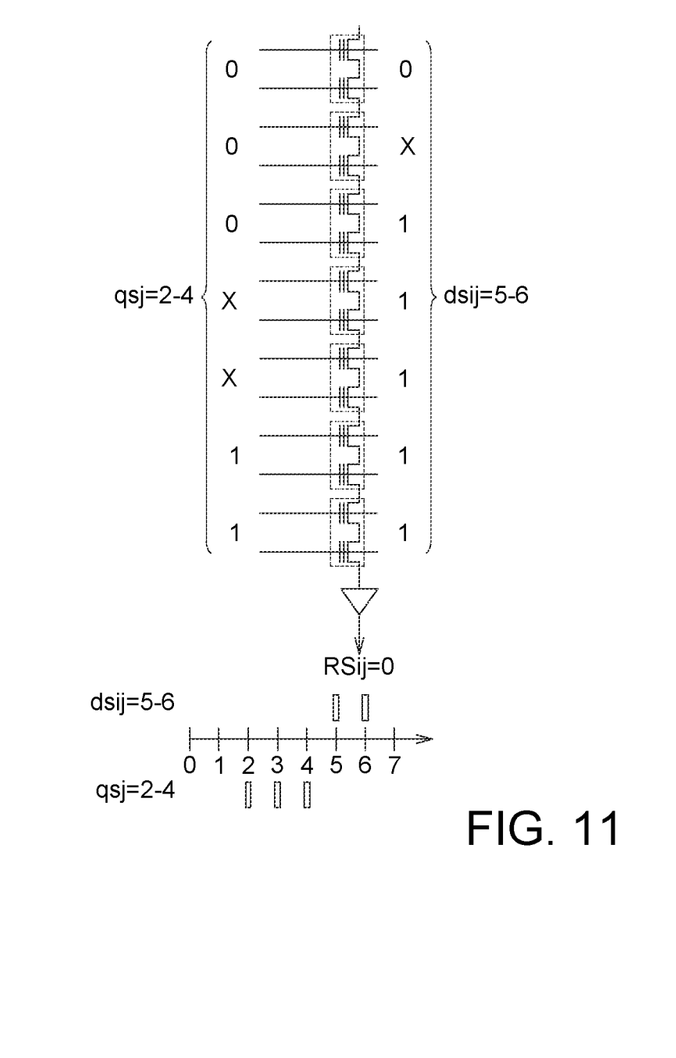

As shown in FIG. 11, the digital string data qsj is 2-4, and the digital string data dsij is 5-6. The digital string data qsj does not overlap the digital string data dsij, so the comparison results RSij is the mismatch signal, such as "0."

Figure 12:
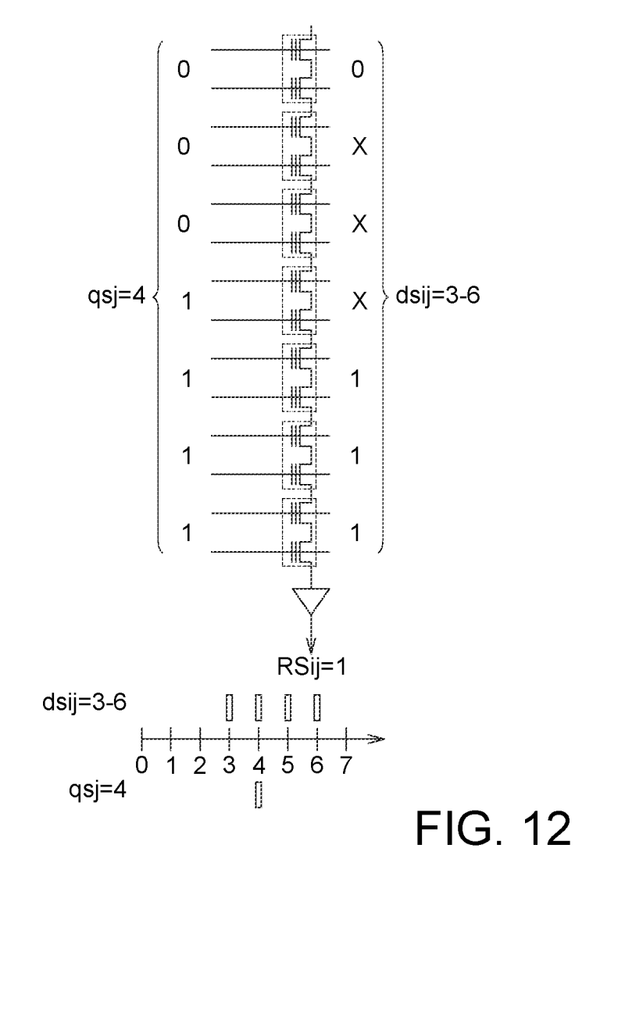

As shown in FIG. 12, the digital string data qsj is 4, and the digital string data dsij is 3-6. The digital string data qsj overlaps the digital string data dsij, so the comparison results RSij is the match signal, such as "1."

Figure 13:
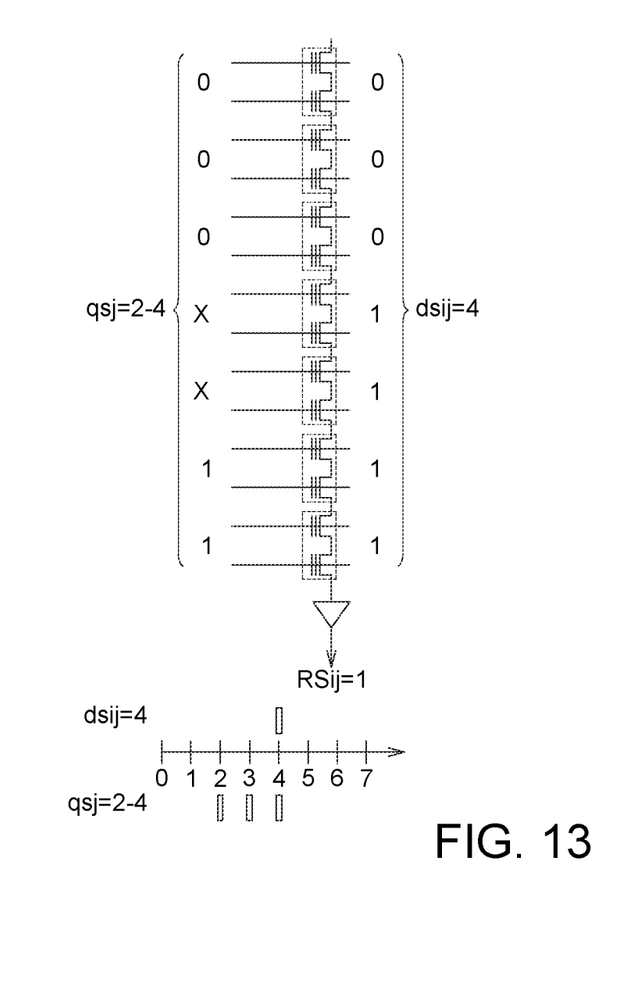

As shown in FIG. 13, the digital string data qsj is 2-4, and the digital string data dsij is 4. The digital string data qsj overlaps the digital string data dsij, so the comparison results RSij is the match signal, such as "1."

Figure 14:
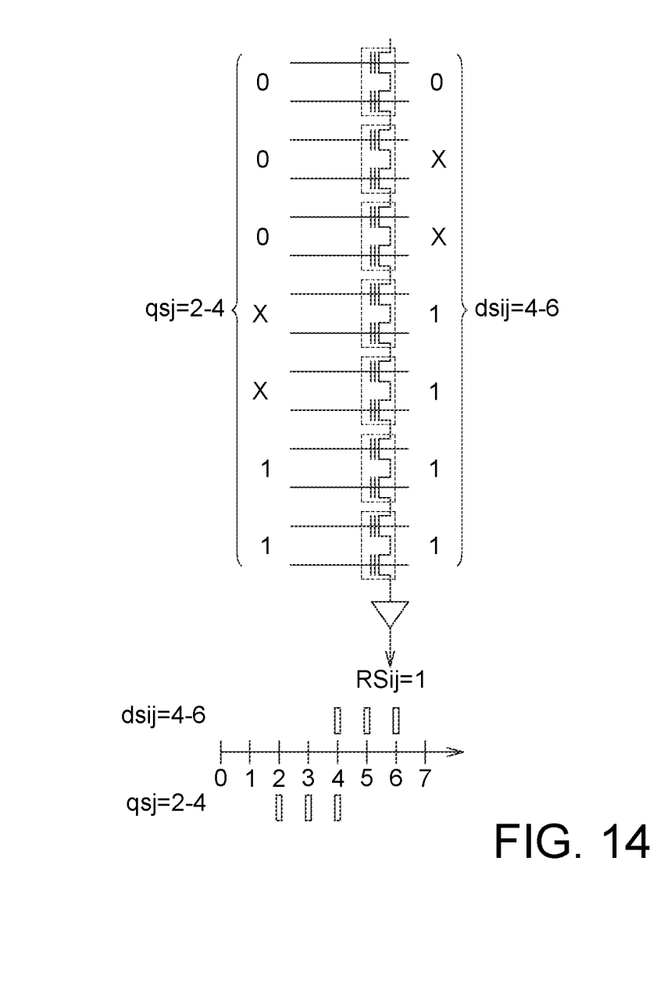

As shown in FIG. 14, the digital string data qsj is 2-4, and the digital string data dsij is 4-6. The digital string data qsj overlaps the digital string data dsij, so the comparison results RSij is the match signal, such as "1."

Figure 15:
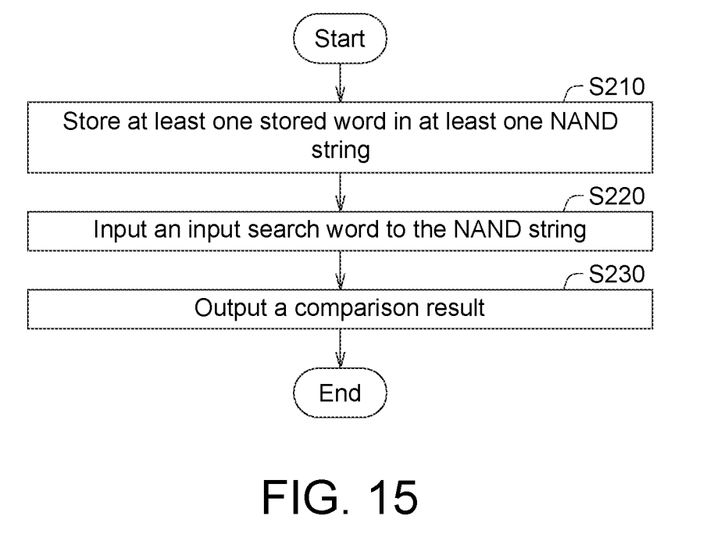
FIG. 15 shows a flowchart of the multilevel searching method for the MCAM.

Based on above, a multilevel searching method for the MCAM 100 is provided. Please refer to FIG. 15, which shows a flowchart of the multilevel searching method for the MCAM 100. In step S210, at least one stored word WDi is stored in at least one NAND string STi. Next, in step S220, the input search word WQ is inputted to the NAND string STi. Then, in step S230, the comparison result RSi is outputted. If the digital string data qsj of the input search word WQ overlap the digital string data dsij of the stored word WDi, the comparison result RSi is a match signal, such as "1." If the digital string data qsj of the input search word WQ do not overlap the digital string data dsij of the stored word WDi, the comparison result RSI is a mismatch signal, "0."

In the embodiments described above, the indicating bit ("1") and the wildcard bit ("X") are used to define the content of thee digital string data qsj, dsij. In one embodiment, the indicating bit may be "0." Please refer to Table which illustrates the digital string data qsj, dsij converted from the multilevel-bit binary data qj, dij according to one embodiment. In the example of the table content of the multilevel-bit binary data qj, dij is an exact value, a number of the indicating bit ("0") in the digital string data qsj, dsij is the exact value.

TABLE III

| multilevel-bit binary data qj, dij | decimal value | digital string data qsj, dsij |
|---|---|---|
| 000 | 0 | 1111111 |
| 001 | 1 | 1111110 |
| 010 | 2 | 1111100 |
| 011 | 3 | 1111000 |
| 100 | 4 | 1110000 |
| 101 | 5 | 1100000 |
| 110 | 6 | 1000000 |
| 111 | 7 | 0000000 |

In the embodiments described above, the indicating bit ("1" or "0") in the digital string data qsj, dsij is piled up at a right side of the digital string data qsj, dsij. In other embodiment, the indicating bit ("1" or "0") in the digital string data qsj, dsij may be piled up at the left side of the digital string data qsj, dsij, or may be arranged with a predefined pattern. Please refer to table IV, the indicating bit ("1") in the digital string data qsj, dsij s piled up at the left side of the digital string data qsj, dsij.

TABLE IV

| multilevel-bit binary data qj, dij | decimal value | digital string data qsj, dsij |
|---|---|---|
| 000 | 0 | 0000000 |
| 001 | 1 | 1000000 |
| 010 | 2 | 1100000 |
| 011 | 3 | 1110000 |
| 100 | 4 | 1111000 |
| 101 | 5 | 1111100 |
| 110 | 6 | 1111110 |
| 111 | 7 | 1111111 |

Please refer to table V, the indicating bit ("1") in the digital string data qsj, dsij is arranged with a predefined pattern. For example, the indicating bit ("1") is alternately piled up at the left side and the right side of the digital string data qsj, dsij.

TABLE V

| multilevel-bit binary data qj, dij | decimal value | digital string data qsj, dsij |
|---|---|---|
| 000 | 0 | 0000000 |
| 001 | 1 | 1000000 |
| 010 | 2 | 1000001 |
| 011 | 3 | 1100001 |
| 100 | 4 | 1100011 |
| 101 | 5 | 1110011 |
| 110 | 6 | 1110111 |
| 111 | 7 | 1111111 |

According to the embodiment described above, the multilevel-bit binary data is converted into the digital string data, such that data in the stored word WDi and the input search word WQ can be defined with valid ranges for search/comparison. Furthermore, an ultra-high throughput can be obtained from the wide memory array 120. For example, a NAND chip has 16 KB (=128 kb) sensing parallelism, so the MCAM 100 can perform 128 k string comparison at the same time.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A multilevel searching method for a multilevel content addressable memory (MCAM), comprising:
    storing a plurality of stored words in a plurality of NAND strings;
    inputting an input search word to the NAND string, wherein each of the stored words and the input search word is converted from a multilevel-bit binary data into a digital string data, if a decimal value of the multilevel-bit binary data is an exact value, a number of an indicating bit in the digital string data is the exact value, a length of the digital string data is equal to or larger than a highest decimal value of the multilevel-bit binary data; and
    outputting a comparison result, wherein if the digital string data of the input search word overlap the digital string data of one of the stored words, the comparison result is a match signal.

2. The multilevel searching method according to claim 1, wherein the indicating bit in the digital string data is piled up at a right side of the digital string data.

3. The multilevel searching method according to claim 1, wherein the indicating bit in the digital string data is piled up at a left side of the digital string data.

4. The multilevel searching method according to claim 1, wherein the indicating bit in the digital string data is arranged with a predefined pattern.

5. The multilevel searching method according to claim 1, wherein the indicating bit is 0 or 1.

6. The multilevel searching method according to claim 1, wherein if the content of the multilevel-bit binary data is a range from a low decimal value to a high decimal value, the number of the indicating bit in the digital string data is the low decimal value, and a sum of the number of the indicating bit and a number of a wildcard bit in the digital string data is the high decimal value.

7. The multilevel searching method according to claim 6, wherein if the content of the multilevel-bit binary data is the range, the wildcard bit is piled up after the indicating bit in the digital string data.

8. The multilevel searching method according claim 1, wherein the digital string data of one of the stored words is divided in more than one parts and stored in more than one of the NAND strings.

9. A multilevel content addressable memory (MCAM), comprising:
    an input encoder, configured to receive an input search word;
    a memory array, comprising a plurality of NAND strings, each of which is configured to store a stored word, wherein each of the stored words and the input search word is converted from a multilevel-bit binary data into a digital string data, if a decimal value of the multilevel-bit binary data is an exact value, a number of an indicating bit in the digital string data is the exact value, a length of the digital string data is equal to or larger than a highest decimal value of the multilevel-bit binary data; and
    an output encoder, configured to receive a plurality of comparison results from the NAND strings.

10. The multilevel content addressable memory according to claim 9, wherein the indicating bit in the digital string data is piled up at a right side or a left side of the digital string data.

11. The multilevel content addressable memory according to claim 9, wherein the indicating bit in the digital string data is arranged with a predefined pattern.

12. The multilevel content addressable memory according to claim 9, wherein if the content of the multilevel-bit binary data is a range from a low decimal value to a high decimal value, the number of the indicating bit in the digital string data is the low decimal value, and a sum of the number of the indicating bit and a number of a wildcard bit in the digital string data is the high decimal value.

* * * * *